(12) United States Patent
Masaki et al.

(10) Patent No.: US 7,771,898 B2
(45) Date of Patent: Aug. 10, 2010

(54) MULTILAYER MIRROR, EVALUATION METHOD, EXPOSURE APPARATUS, DEVICE MANUFACTURING METHOD

(75) Inventors: Fumitaro Masaki, Utsunomiya (JP); Akira Miyake, Nasukarasuyama (JP)

(73) Assignee: Canon Kabushiki Kaisha (JP)

( * ) Notice: Subject to any disclaimer, the term of this patent is extended or adjusted under 35 U.S.C. 154(b) by 496 days.

(21) Appl. No.: 11/760,155

(22) Filed: Jun. 8, 2007

(65) Prior Publication Data

US 2007/0287076 A1 Dec. 13, 2007

(30) Foreign Application Priority Data

Jun. 9, 2006 (JP) .............................. 2006-160512

(51) Int. Cl.
*G03F 1/00* (2006.01)
*G03B 27/42* (2006.01)

(52) U.S. Cl. ............................................. 430/5; 355/53
(58) Field of Classification Search ...................... 430/5; 355/53
See application file for complete search history.

(56) References Cited

U.S. PATENT DOCUMENTS

| 6,134,049 | A | 10/2000 | Spiller et al. | |
|---|---|---|---|---|
| 6,387,572 | B1 * | 5/2002 | Tong et al. | 430/5 |
| 6,756,163 | B2 * | 6/2004 | Yan | 430/5 |
| 2005/0064298 | A1 * | 3/2005 | Silverman | 430/5 |
| 2005/0100797 | A1 * | 5/2005 | Shoki et al. | 430/5 |

* cited by examiner

*Primary Examiner*—Mark F Huff
*Assistant Examiner*—Jonathan Jelsma
(74) *Attorney, Agent, or Firm*—Rossi, Kimms & McDowell LLP

(57) ABSTRACT

A multilayer mirror used for EUV light includes a substrate, a reflection layer for reflecting the EUV light, a stress compensation layer, formed between the substrate and the reflection layer, for compensating a deformation of the substrate by the reflection layer, wherein the substrate has a first area, in which the stress compensation layer is layered but no reflection layer is layered.

7 Claims, 13 Drawing Sheets

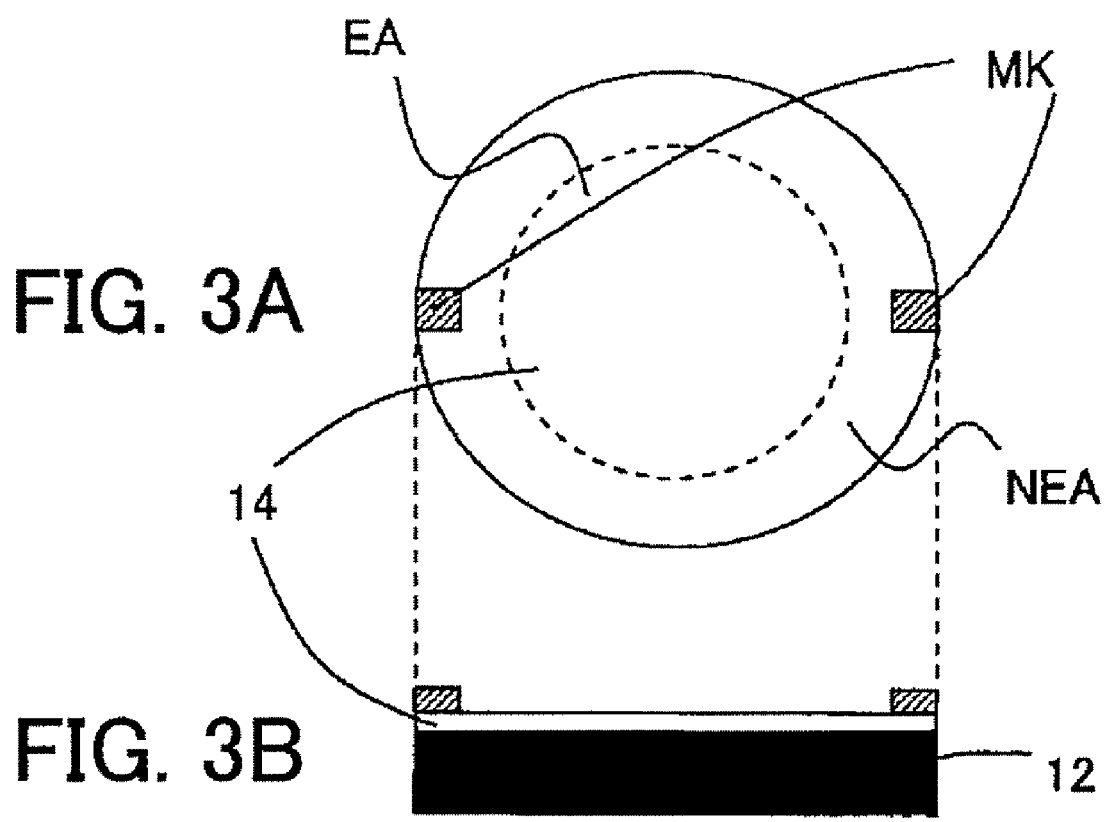

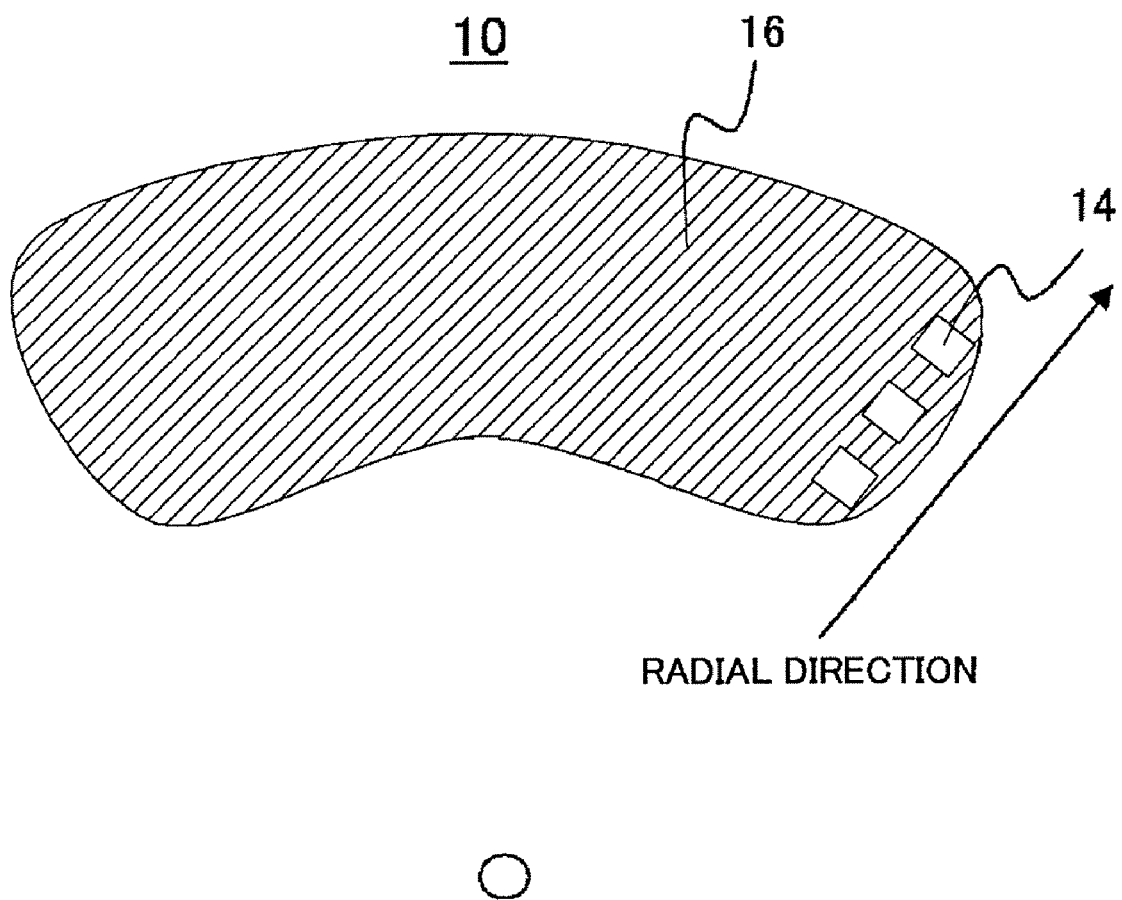
FIG. 7

PRIOR ART
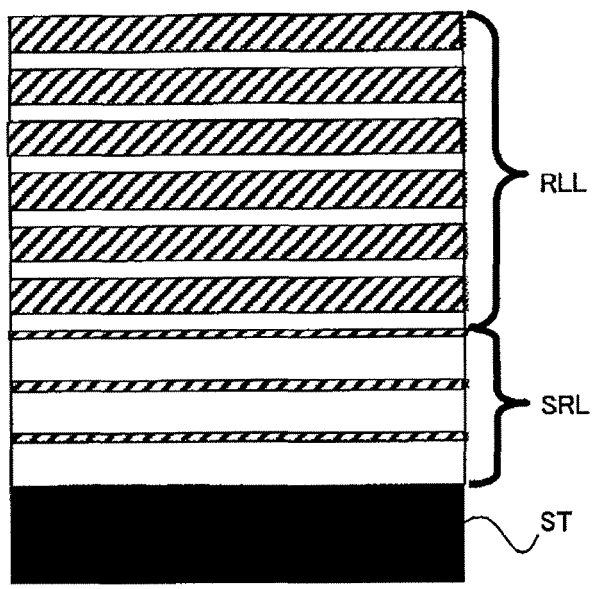
FIG. 13
PRIOR ART
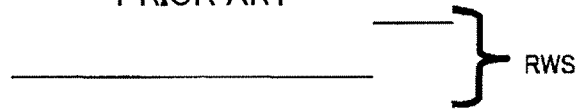
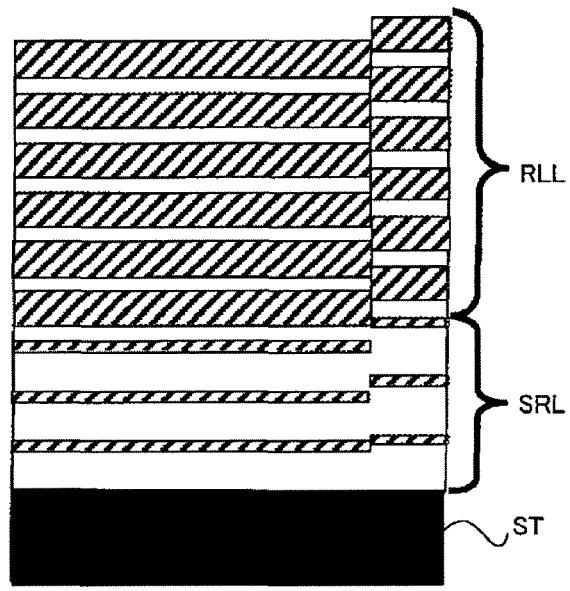
FIG. 14

MULTILAYER MIRROR, EVALUATION METHOD, EXPOSURE APPARATUS, DEVICE MANUFACTURING METHOD

BACKGROUND OF THE INVENTION

1. Field of the Invention

The present invention relates to a multilayer mirror, an evaluation method, and an exposure apparatus.

2. Description of the Related Art

In manufacturing a fine semiconductor device using the photolithography technology, a conventional projection exposure apparatus projects and transfers a circuit pattern of a mask (reticle) onto a wafer via a projection optical system.

The minimum size (or resolution) transferable by the projection exposure apparatus is in proportion to the wavelength of the light used for the exposure, and inversely proportional to the numerical aperture ("NA") of the projection optical system. Therefore, use of a shorter wavelength improves the resolution, and the use of a shorter wavelength of the exposure light is promoted along with the recent demand for fine processing to semiconductor devices. More specifically, use of a short wavelength of the ultraviolet ("UV") light as the exposure light is promoted from the ultra-pressure mercury lamp (i-line with a wavelength of about 365 nm) to the KrF excimer laser (with a wavelength of about 248 nm and the ArF excimer laser (with a wavelength of about 193 nm).

However, the lithography using the UV light has limits in view of the recent increasingly miniaturized semiconductor devices. Accordingly, one proposed projection exposure apparatus uses the EUV light having a wavelength between about 10 nm and 15 nm that is shorter than a wavelength of the UV light, which will be referred to as a EUV exposure apparatus.

The light absorption in a material becomes conspicuous in the EUV region, and a refraction type optical element or dioptric system that utilizes refractions of the light used for the visual light and the UV light is no longer practical. Accordingly, the EUV exposure apparatus uses a reflection type optical element (catoptric system) that utilizes reflections of the light. The reflection type optical element in the EUV exposure apparatus includes a grazing-incidence total-reflection mirror and a multilayer mirror.

In the EUV region, a real part of the refractive index is slightly smaller than 1, and generates total reflection if the incident angle is made so large that the EUV light is incident close to the reflection surface. A grazing-incidence total-reflection mirror can usually maintain its reflectance of 80% or higher for obliquely incident light within scores of degrees from the reflection surface. Since the grazing-incidence total-reflection mirror has a small design freedom and leads to a large optical system, use of the mirror is impracticable.

Accordingly, the reflection type optical element in the EUV exposure apparatus uses a multilayer mirror that alternately layers two kinds of materials, such as molybdenum (Mo) and silicon (Si), having different optical constants. A sum of two layer thicknesses of two kinds of materials is generally referred to as a layer thickness.

The multilayer mirror can be used at an incident angle close to the normal incidence and maintains a high reflectance. The multilayer mirror reflects, when receiving the EUV light, the EUV light with a specific wavelength, exhibiting the wavelength selectivity. For example, where is an incident angle, is a wavelength of the EUV light, d is a layer thickness, and m is an order, the efficiently reflected EUV light is the one having a narrow bandwidth around the wavelength as the center which approximately satisfies the Bragg's equation as Equation 1 below:

$$2 d \times \cos \theta = m \times \lambda \quad \text{EQUATION 1}$$

The EUV exposure apparatus is used to expose a circuit pattern of 0.1 μm or smaller, and requires a highly precise reflection surface shape for the multilayer mirror (particularly in the projection optical system). For example, a shape error budget σ (rms value) permitted to the mirror is given in the Marechal's criterion as Equation 2 below, where λ is a wavelength of the EUV light, and n is the number of multilayer mirrors in the projection optical system. For instance, when the projection optical system has four multilayer mirrors, and the wavelength λ of the EUV light is 13 nm, the shape error budget σ is 0.23 nm.

$$\sigma = \frac{\lambda}{28 \times \sqrt{n}} \quad \text{EQUATION 2}$$

The Mo/Si multilayer film as the multilayer film for the multilayer mirror in the EUV exposure apparatus generally has a stress, which deforms a multilayer-mirror substrate and causes fluctuations in the wavefront of the reflected light (or the reflected wavefront). As a result, the optical characteristic, such as an imaging characteristic, of the multilayer mirror deteriorates.

There are conventionally proposed some technologies that reduce a deformation of the multilayer-film substrate caused by the multilayer film. See U.S. Pat. No. 6,134,049. This reference restrains a deformation of a substrate ST, as shown in FIG. 13, by arranging between the substrate ST and a multilayer film (reflection layer) RLL a multilayer film (stress compensation layer) SRL that produces an (inverse) stress opposite to the stress by the reflection layer RLL that reflects the EUV light. FIG. 13 is a schematic sectional view showing a structure of the conventional multilayer mirror having the stress compensation layer SRL.

Nevertheless, the stress compensation layer that does not maintain a desired precision cannot cancel out the stress of the reflection layer, leaving the deformation of the substrate, and further deforming the substrate. In addition, even for the substrate ST that maintains at the desired shape, the stress compensation layer SRL that has an uneven layer thickness distribution, as shown in FIG. 14, disturbs reflected wavefront RWS from the reflection layer RLL. It is important for a high imaging characteristic to precisely form the stress compensation layer on the substrate, and there is a demand to examine or evaluate the stress compensation layer. However, the stress compensation layer is formed between the substrate and the reflection layer, and it is very difficult to examine the stress compensation layer in a non-destructive manner.

In addition, an evaluation of the reflected wavefront of a single multilayer mirror is very difficult, and an evaluation method that can easily evaluate the multilayer mirror is sought.

BRIEF SUMMARY OF THE INVENTION

The present invention is directed to a multilayer mirror and an evaluation method, which can easily examine or evaluate a stress compensation layer, and realizes an excellent optical characteristic, such as an imaging characteristic.

A multilayer mirror according to one aspect of the present invention used for EUV light includes a substrate, a reflection layer for reflecting the EUV light, a stress compensation layer, formed between the substrate and the reflection layer, for compensating a deformation of the substrate by the stress of reflection layer, wherein the substrate has a first area, in which the stress compensation layer is layered but no reflection layer is layered.

Further features of the present invention will become apparent from the following description of exemplary embodiments with reference to the attached drawings.

BRIEF DESCRIPTION OF THE DRAWINGS

FIGS. 3A and 3B are top and side views of the multilayer mirror for explaining a manufacture of the multilayer mirror shown in FIG. 1 (or a formation of a reflection layer in the step 1006 shown in FIG. 2).

FIG. 7 is a schematic plane view showing the multilayer mirror according to one aspect of the present invention.

FIG. 13 is a schematic sectional view showing a structure of a conventional multilayer mirror having a stress compensation layer.

FIG. 14 is a schematic sectional view showing the conventional multilayer mirror having the stress compensation layer having an uneven layer thickness distribution.

DESCRIPTION OF THE EMBODIMENTS

Figure 1:
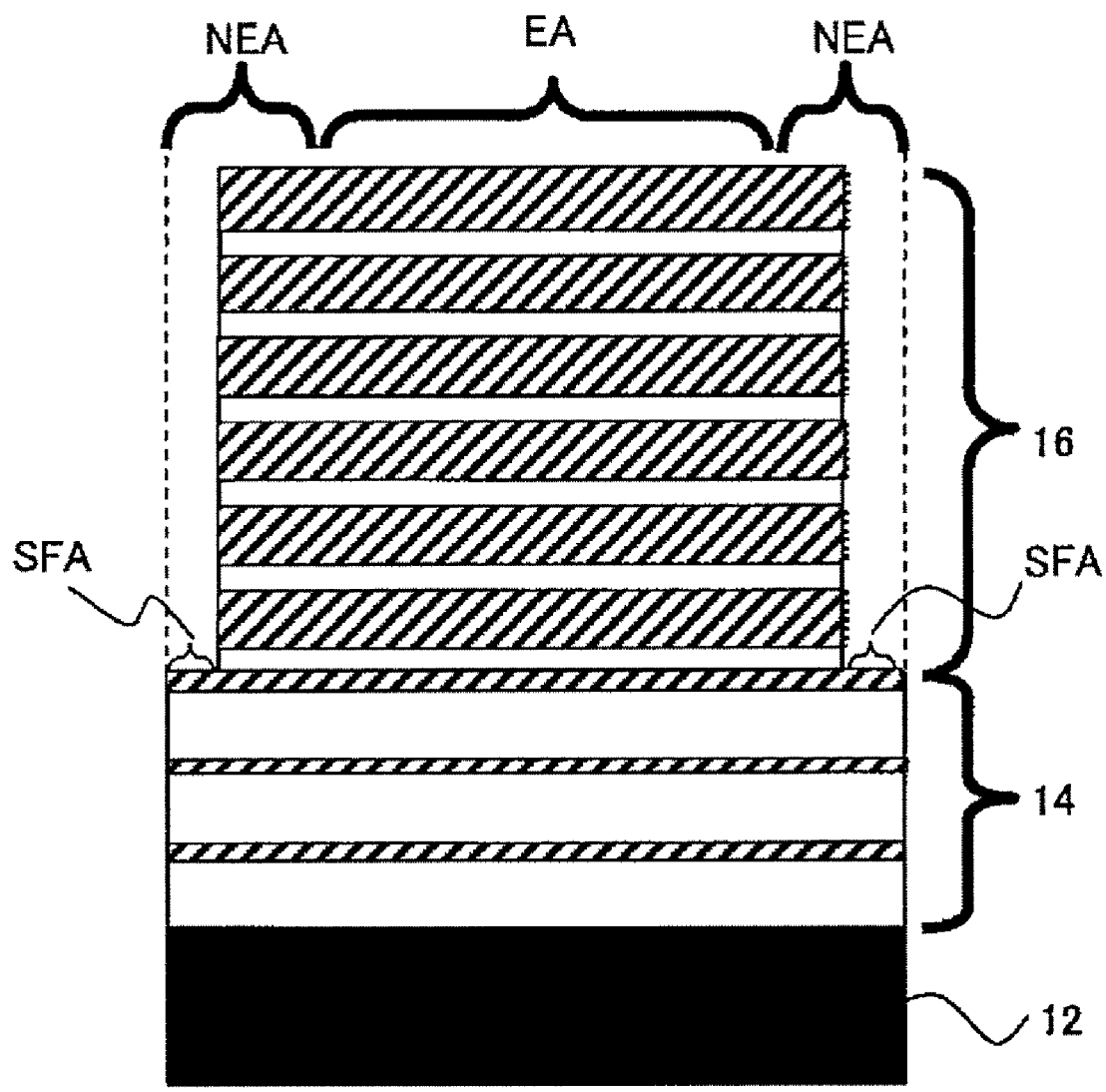
FIG. 1 is a schematic sectional view showing a structure of a multilayer mirror according to one aspect of the present invention.

Referring now to the accompanying drawings, a description will be given of an embodiment of the present invention. In each figure, the same reference numeral designates the same element, and a duplicate description thereof will be omitted.

FIG. 1 is a schematic sectional view showing a structure of the multilayer mirror 10 according to one aspect of the present invention. The multilayer mirror 10 is a mirror that reflects the EUV light and is used for the EUV light wavelength range. The multilayer mirror 10 includes a substrate 12, a stress compensation layer 14, and a reflection layer 16. While FIG. 1 schematically illustrates the stress compensation layer 14 and the reflection layer 16, the actual stress compensation layer has 10 to 30 pairs of layers, and the actual reflection layer has 30 to 70 pairs of layers.

The substrate 12 is made of a material, such as low thermal expansion glass and silicon carbide, which has high rigidity and hardness and a small coefficient of thermal expansion. The substrate 12 has a predetermined reflection surface shape made through cutting and polishing.

The stress compensation layer 14 is formed on the substrate 12 or between the substrate 12 and the reflection layer 16, which will be described later. The stress compensation layer 14 of this embodiment is layered on the entire substrate 12. The stress compensation layer 14 produces an inverse stress opposite to the stress applied by the reflection layer 16, and mitigates a deformation of the substrate 12 caused by the reflection layer 16. In other words, the stress compensation layer 14 maintains a predetermined reflection surface shape of the substrate 12. The stress compensation layer 14 includes a multilayer film or coating, and its concrete structure etc, will be described later.

The reflection layer 16 is formed on the stress compensation layer 14, has a high reflectance to the EUV light, and efficiently reflects the EUV light. The reflection layer includes a multilayer film or coating, and its concrete structure etc, will be described later. The reflection layer 16 is not formed on the entire stress compensation layer 14 laminated on the substrate 12, but covers an effective area EA of the multilayer mirror 10, and exposes part of the stress compensation layer 14 to the surface in an ineffective area NEA. The multilayer mirror 10 has (first) areas SFA on the substrate 12 in the ineffective areas NEA, in which only the stress compensation layer 14 exposes to the surface. The multilayer mirror has a (second) area on the substrate 12 in the effective area EA, in which both the reflection layer 16 and the stress compensation layer 14 are formed. The area SFA in which only the stress compensation layer 14 is formed or exposed to the surface enables the stress compensation layer 14 to be examined or evaluated in a non-destructive manner after the reflection layer 16 is laminated. The effective area EA of the multilayer mirror 10 is an (irradiation) area in which the EUV light is irradiated when the multilayer mirror 10 is mounted into the exposure apparatus. The ineffective area is a (non-irradiated) area that does not receive the EUV light.

Figure 2:
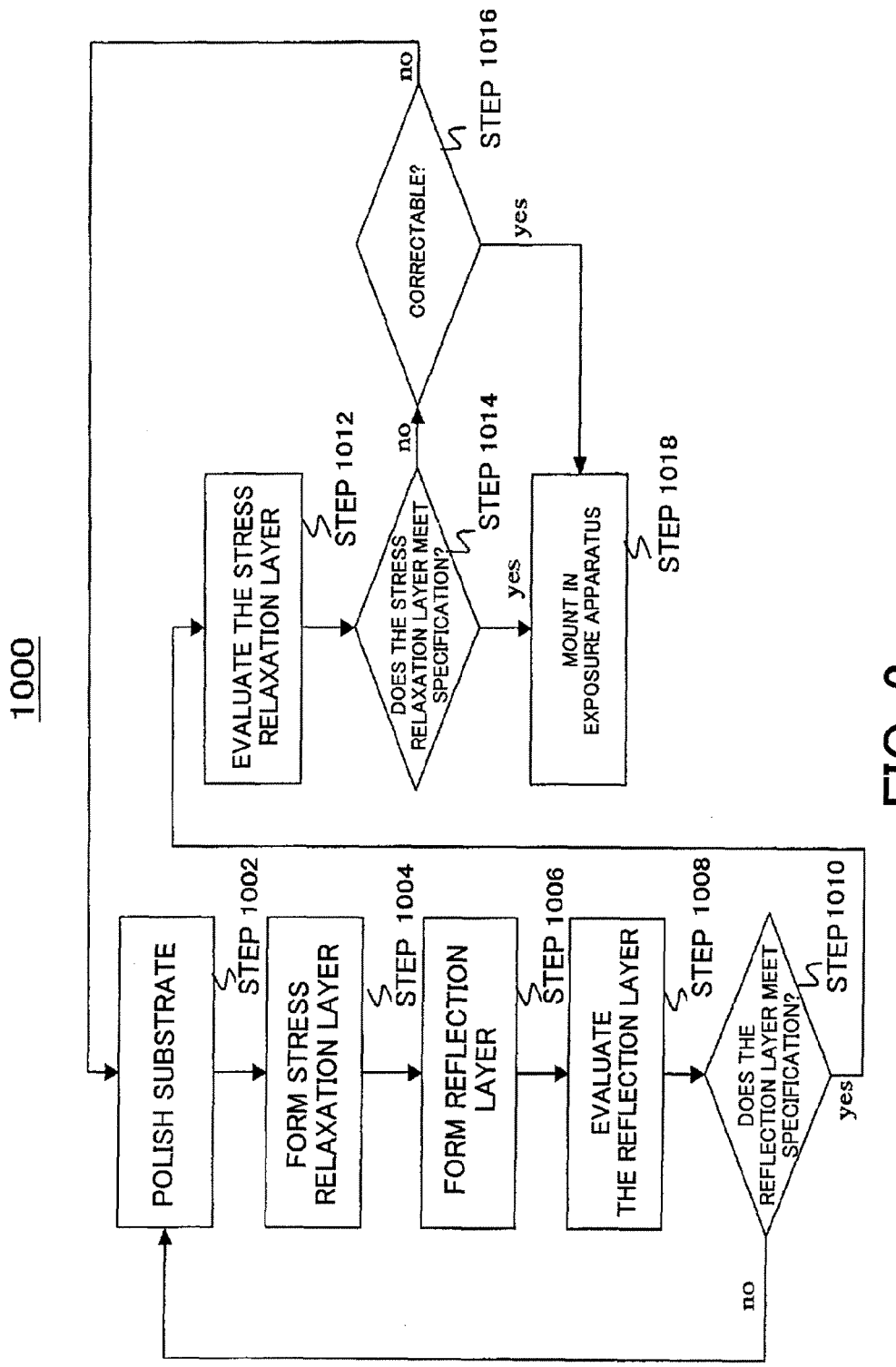
FIG. 2 is a flowchart for explaining an evaluation method of a multilayer mirror according to one aspect of the present invention.

Referring now to FIG. 2, a description will be given of an evaluation method 1000 of the multilayer mirror 10 with a manufacturing method of the multilayer mirror 10. FIG. 2 is a flowchart for explaining a procedure from polishing of the substrate 12 in the multilayer mirror 10 to mounting of the completed multilayer mirror 10 into the exposure apparatus. Initially, the substrate 12 is polished into a predetermined reflection surface shape (step 1002), and the stress compensation layer 14 is formed on the substrate 12 that has been polished into the predetermined reflection surface (step 1004). A material of the stress compensation layer 14 or a material of the multilayer film is not particularly limited, but use of the same material as that of the reflection layer 16 is preferable for simplification of the film formation apparatus. When the reflection layer 16 has a compressive stress, the stress compensation layer 14 needs a tensile stress that is an inverse stress of the compressive stress.

The Mo/Si multilayer film varies the stress depending upon its thickness, and can be used for the reflection layer 16 when the layer thickness and the number of layers are properly adjusted, or for the stress compensation layer 14 that cancels out the stress of the reflection layer 16. For example, in order to efficiently reflect the EUV light that has a wavelength of 13.5 nm and an incident angle of 5°, the reflection layer 16 uses a Mo/Si multilayer film that has a layer thickness of 7 nm and 40 pairs of layers. Thereby, the reflection layer 16 and the stress compensation layer 14 can generate stresses having opposite codes, and the magnitude of each stress is about 400 MPa.

Figures 4A, 4B:
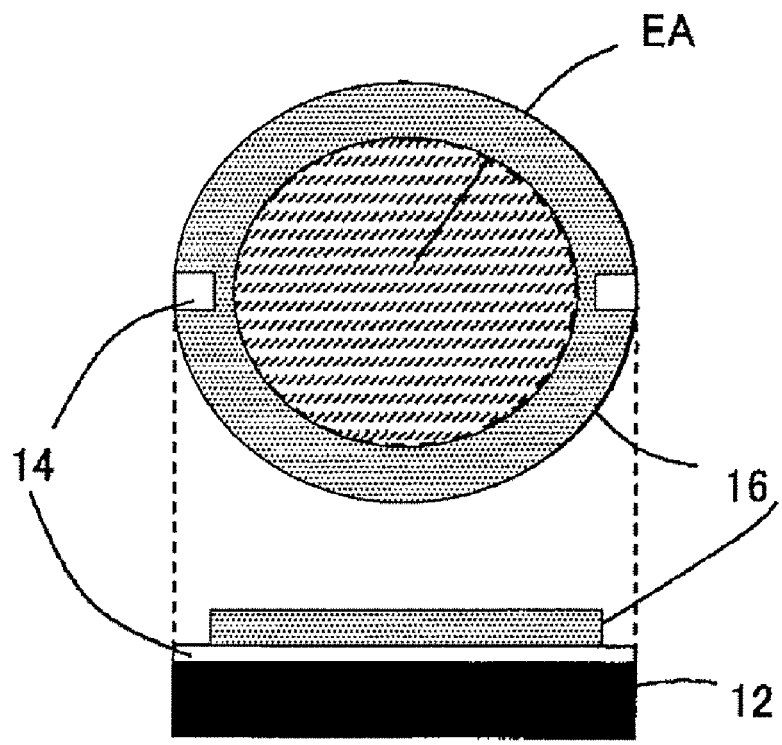
FIGS. 4A and 4B are top and side views of the multilayer mirror for explaining a manufacture of the multilayer mirror shown in FIG. 1 (or a formation of a reflection layer in the step 1006 shown in FIG. 2).

When the stress compensation layer 14 is formed on the substrate 12, the reflection layer 16 is formed on the stress compensation layer 14 (step 1006). More specifically, after the stress compensation layer 14 is formed, a mask MK is attached to the ineffective area NEA outside the effective area EA on the stress compensation layer 14, as shown in FIGS. 3A and 3B. The reflection layer 16 is formed on the stress compensation layer 14 to which the mask MK has been attached, and the mask MK is detached after the reflection layer 16 is formed. The reflection layer 16 is not formed in the areas in which the mask MK is attached because of the mask MK, the manufactured multilayer mirror 10 exposes the stress compensation layer 14 to the surface as shown in FIGS. 4A and 4B in the ineffective area NEA outside the effective area EA. Here, FIGS. 3A to 4B are views for explaining the manufacture of the multilayer mirror 10 (or a formation of the reflection layer 16 in the step 1006). FIGS. 3A and 4A are top views of the multilayer mirror 10, and FIGS. 3B and 4B are side views of the multilayer mirror 10.

The mask MK has a size that is necessary to evaluate the state of the stress compensation layer 14 in the step 1012, which will be described later, but that does not affect the shape of the substrate 12 after the reflection layer 16 is formed. The influence on the shape of the substrate 12 needs to be reduced, for example, down to a wavelength aberration of 10 m or smaller due to the shape variation.

Figure 5:
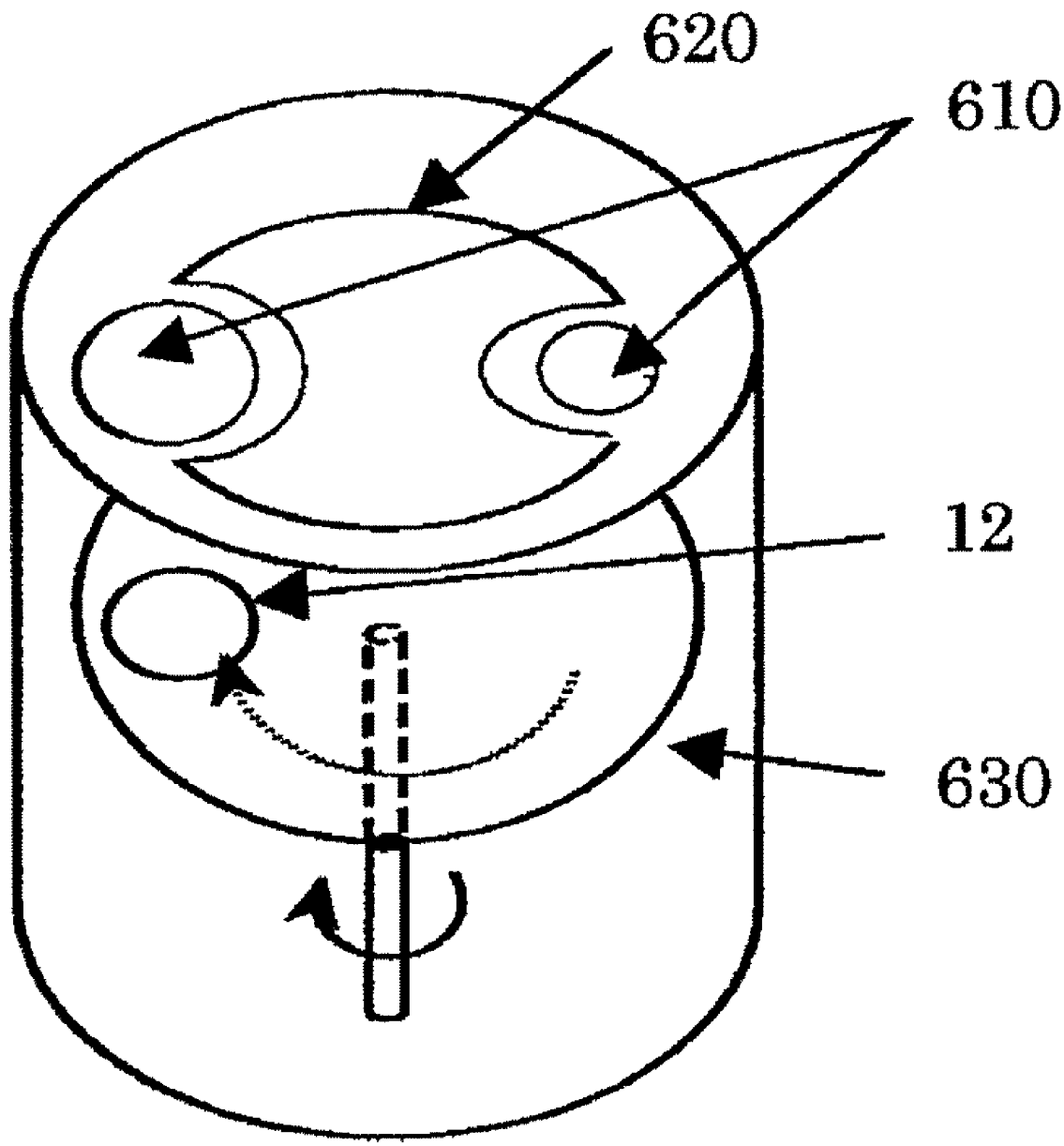
FIG. 5 is a schematic perspective view showing a structure of a general film formation apparatus used for the steps 1004 and 1006 shown in FIG. 2.

A general film formation apparatus 600 is used to form the stress compensation layer 14 and the reflection layer 16 in the steps 1004 and 1006, as shown in FIG. 5. FIG. 5 is a schematic perspective view showing a structure of the film formation apparatus 600. The film formation apparatus 600 includes a vapor deposition source 610 that accommodates a material of the multilayer film, such as the stress compensation layer 14 and the reflection layer 16, formed on the substrate 12, a shutter 620, and a substrate holder 630 that holds the substrate 12. The film formation apparatus 600 can improve the layer thickness uniformity in the circumferential direction of the stress compensation layer 14 or the reflection layer 16 (or the multilayer film 10) by increasing the number of rotations of the substrate 12 or the substrate holder 630, in forming the stress compensation layer 14 or the reflection layer 16 on the substrate 12. The film formation apparatus 600 controls the layer thickness distribution of the stress compensation layer 14 or the reflection layer 16 by the shutter 620 arranged between the substrate 12 and the vapor deposition source 610. However, a structure of the film formation apparatus used to form the stress compensation layer 14 and the reflection layer 16 in the steps 1004 and 1006 is not limited to the structure shown in FIG. 5, and can apply any structures known in the art.

Turning back to FIG. 2, after the stress compensation layer 14 and the reflection layer 16 are formed on the substrate 12, the state of the reflection layer 16 is evaluated (step 1008). More specifically, at least one of the surface roughness, the reflectance to the EUV light, and the layer thickness (or the film thickness) of the reflection layer 16 is examined or detected by using an atomic force microscope ("AFM"), a reflectometer, and an X-ray diffraction, and the film of the reflection layer 16 is evaluated based on the result. The state of the reflection layer 16 is preferably evaluated at plural positions.

Next, it is determined based on the state of the reflection layer 16 evaluated in the step 1008 whether the reflection layer 16 meets the specification (or whether the multilayer mirror 10 is usable) (step 1010). More specifically, the surface roughness, the reflectance to the EUV light, and/or layer thickness of the reflection layer 16 evaluated in the step 1008 are compared with thresholds. For example, the specification is met when the surface roughness (surface shape) of the reflection layer is 0.2 nm or smaller (preferably 0.1 nm or smaller), and the specification is not met when that exceeds 0.2 nm. Then, the multilayer film is removed and applied again. Whether the specification of the reflectance is met is determined based on whether the desired reflectance (55% or greater, more specifically 60% or greater) is obtained. Thus, the steps 1008 and 1010 are steps of evaluating the reflection layer 16. In measuring the layer thickness of the reflection layer rather than the surface roughness of the reflection layer, an error is preferably maintained 0.1 nm or smaller (preferably 0.05 nm or smaller). Of course, the above values used for the criterion slightly changes with a different optical design, but the above values can be used for the projection optical system that has four to eight mirrors. This is true of reference values of the following stress compensation layer.

The stress compensation layer 14 and the reflection layer 16 formed on the substrate 12 are removed from the multilayer mirror if the reflection layer 16 is determined not to meet the specification in the step 1010, and the procedure returns to the step 1002 to repeat polishing of the substrate 12. The multilayer mirror having the reflection layer 16 that does not meet the specification include, for example, a multilayer mirror in which the surface roughness of the reflection layer 16 is greater than the threshold, a multilayer mirror in which the reflectance to the EUV light of the reflection layer 16 is lower than the threshold, a multilayer mirror in which the reflection layer 16 has an uneven layer thickness, and a multilayer mirror in which the reflection layer 16 does not possess a designed layer thickness.

On the other hand, the state of the stress compensation layer 14 is evaluated in the multilayer mirror if the reflection layer 16 is determined to meet the specification in step 1010 (step 1012). The evaluation of the state of the stress compensation layer 14 uses the area in which the stress compensation layer 14 is exposed to the surface or the first surface SFA in which only the stress compensation layer 14 is formed. This embodiment uses an atomic force microscope ("AFM"), a reflectometer, and an X-ray diffraction to examine or detect at least one of the surface roughness, the reflectance to the EUV light, and the layer thickness (or the film thickness) of the stress compensation layer 14, and the film of the stress compensation layer is evaluated based on the result. For example, the specification is met when the surface roughness (surface shape) of the stress compensation layer is 0.1 nm or smaller (preferably 0.05 nm or smaller) equivalent to the reflection layer, and the specification is not met when that exceeds 0.1 nm. Then, the multilayer film is removed and applied again. In measuring the film thickness of the stress compensation layer itself, an error of the film thickness is preferably 0.08 nm or smaller (preferably 0.05 nm or smaller). When the film thickness error exceeds 0.08 nm, the multilayer film is removed and applied again. The reflectance of the stress compensation layer differs according to its structure, but is considered permissible if the stress compensation layer has a reflectance of 80% or greater (preferably 90% or greater) in comparison with the reflectance of the ideal stress compensation layer. More specifically, the stress compensation layer preferably has a reflectance of 20% or greater (preferably 30% or greater). Preferably, the substrate 12 has plural areas SFAs in each of which only the stress compensation layer 14 is formed, and the state of the stress compensation layer 14 is evaluated for each area. The plural areas SFAs are arranged along the radial direction of the substrate (in which the layer thickness changes).

Next, whether the stress compensation layer 14 meets the specification (or whether the multilayer mirror 10 is usable) is determined based on the state of the stress compensation layer 14 evaluated by the step 1012 (step 1014). More specifically, the surface roughness, the reflectance to the EUV light, and/or the layer thickness of the stress compensation layer 14 are compared with thresholds. The steps 1012 and 1014 are steps to evaluate the stress compensation layer 14.

The multilayer mirror in which the stress compensation layer 14 that is determined to meet the specification in the step 1014 is mounted into the exposure apparatus (step 1018).

The stress compensation layer 1014 does not meet the specification, partially because of a polishing failure and another failure in the process used to form the stress compensation layer 14. When the layer thickness of the stress compensation layer 14 does not meet the specification, a given stress is unavailable. When the step 1014 determines that the stress compensation layer 14 does not meet the specification, it is then determined whether an apparatus that uses the multilayer mirror or the multilayer mirror itself can correct the error (step 1016). A description will now be given of an illustrative method of correcting the multilayer mirror. Initially, the layer thickness of the stress compensation layer 14 is found from the evaluation result in the step 1012. The Mo/Si multilayer film's stress depends upon the layer thickness, and the stress of the stress compensation layer 14 is found from its layer thickness, and the deformation amount of the substrate 12 is estimated due to the stresses by the stress compensation layer 14 and the reflection layer 16. A curvature variance amount of the reflection surface shape of the multilayer mirror 10 is estimated from the variance amount of the substrate 12. In general, the curvature variation of the surface shape of the multilayer mirror 10 is correctable (and the imaging characteristic of the exposure apparatus can be maintained) by adjusting distances among mirrors. The deformation influence of the substrate 12 can be thus eliminated in the assembly and adjustment of the exposure apparatus in mounting the multilayer mirror 10 into the exposure apparatus. Alternatively, an actuator may be attached to a back surface of the substrate 12 (of the multilayer mirror 10) and used to deform the substrate 12 and to change the variance of the surface shape of the multilayer mirror, reducing or eliminating the surface shape of the multilayer mirror. A correction amount may be used as a generic term of a curvature variation amount of the multilayer mirror, a variation amount with respect to a certain axis, and a weighed amount to the multilayer mirror. When the surface shape of the multilayer mirror is adjusted to make the multilayer mirror usable, the correction amount is an adjustment amount used to adjust the surface shape of the multilayer mirror.

The multilayer mirror 10 that is determined correctable in the step 1016 is mounted into the exposure apparatus (step 1018). The stress compensation layer 14 and the reflection layer 16 are removed from the multilayer mirror that is determined uncorrectable, and the procedure returns to the step 1002 to repeat polishing of the substrate 12.

Thus, the inventive multilayer mirror 10 can easily examine or evaluate the stress compensation layer 14 even after the reflection layer 16 is formed. According to the multilayer mirror 10 that is determined usable by the inventive evaluation method 1000, both the stress compensation layer 14 and the reflection layer 16 meet the specifications, and provide an excellent optical characteristic (or imaging characteristic). In addition, the inventive evaluation method 1000 can easily evaluate the multilayer mirror 10 by examining the stress compensation layer 14.

Figure 6:
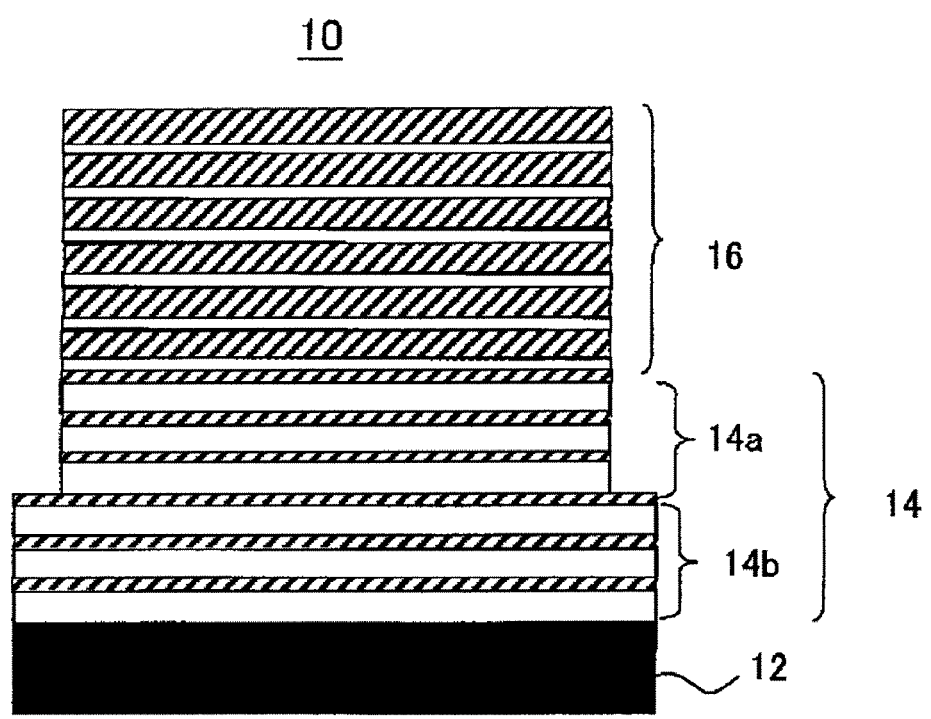
FIG. 6 is a schematic sectional view showing a structure of the multilayer mirror according to one aspect of the present invention.

Since the stress compensation layer 14 produces the stress opposite to the stress by the reflection layer 16, the area SFA in which only the stress compensation layer 14 is formed on the substrate 12 may negatively affect the shape of the substrate 12. Assume the multilayer mirror 10 shown in FIG. 6 in which the number of films of a stress compensation layer 14a formed below the reflection layer 16 is different from the number of films of a stress compensation layer 14b corresponding to the area SFA in which only the stress compensation layer 14 is formed. FIG. 6 is a schematic sectional view showing a structure of the multilayer mirror 10.

Referring to FIG. 6, there is no reflection layer 16 that cancels the stress of the stress compensation layer 14b above the area SFA in which only the stress compensation layer 14 is formed, and it is thus conceivable that the substrate 12 deforms. As discussed above, the stress depends upon the number of films, and increases in proportion as the number of films increases. Thus, the number of films of the stress compensation layer 14b is preferably small, although it is enough large to evaluate the state of the stress compensation layer 14 (14a).

For example, in evaluating reflectance to the EUV light, the multilayer mirror 10 can be evaluated at a necessary precision as long as the reflectance of about 30% is obtained. More specifically, in the stress compensation layer 14 having a layer thickness of 11 nm, the reflectance in the wavelength region of the EUV light between the wavelength between 10 nm and 20 nm is about 30% for 10 pairs of layers. As discussed above, in order to cancel the stress of the reflection layer 16 having about 40 pairs of layers and a layer thickness of 7 nm, the stress compensation layer 14 needs a coating cycle of 11 nm and 20 pairs of layers, but the stress compensation layer 14b needs merely 10 pairs of layers to evaluate the stress evaluation layer 14. Of course, this is not limited to the evaluation of the reflectance to the EUV light, and the stress compensation layer 14b has the number of films necessary to evaluate the state of the stress compensation layer 14 for a target item. Thus, the influence on the shape of the substrate 12 can be lessened by reducing the number of films of the stress compensation layer 14b.

The multilayer mirror mounted into the exposure apparatus has various incident angles on the substrate, and the reflection layer 16 has a layer thickness distribution corresponding to the incident angle distribution. Since the stress depends upon the layer thickness, the stress of the reflection layer 16 distributes on the plane. Therefore, the stress compensation layer 14 needs a corresponding layer thickness distribution.

Assume the multilayer mirror 10 shown in FIG. 7. The multilayer mirror 10 has a rotating center at out of the substrate. The stress compensation layer 14 and the reflection layer 16 are formed around the rotating center. The reflection layer 16 has a layer thickness distribution in the radial direction, and a constant layer thickness in the circumferential direction. The stress compensation layer 14 also has a layer thickness distribution or changes a film thickness cyclically in the radial direction, and a constant layer thickness in the circumferential direction.

In general, it is more difficult to achieve the desired layer thickness distribution in the radial direction than achieving layer thickness uniformity in the circumferential direction. The multilayer mirror 10 shown in FIG. 7 improves the precision of the evaluation of the multilayer mirror 10, and is configured to evaluate the state of the stress compensation layer 14 in the radial direction. Thereby, in evaluating the stress compensation layer 14, it can be confirmed whether the layer thickness distribution of the stress compensation layer 14 is a desired distribution.

Figure 8:
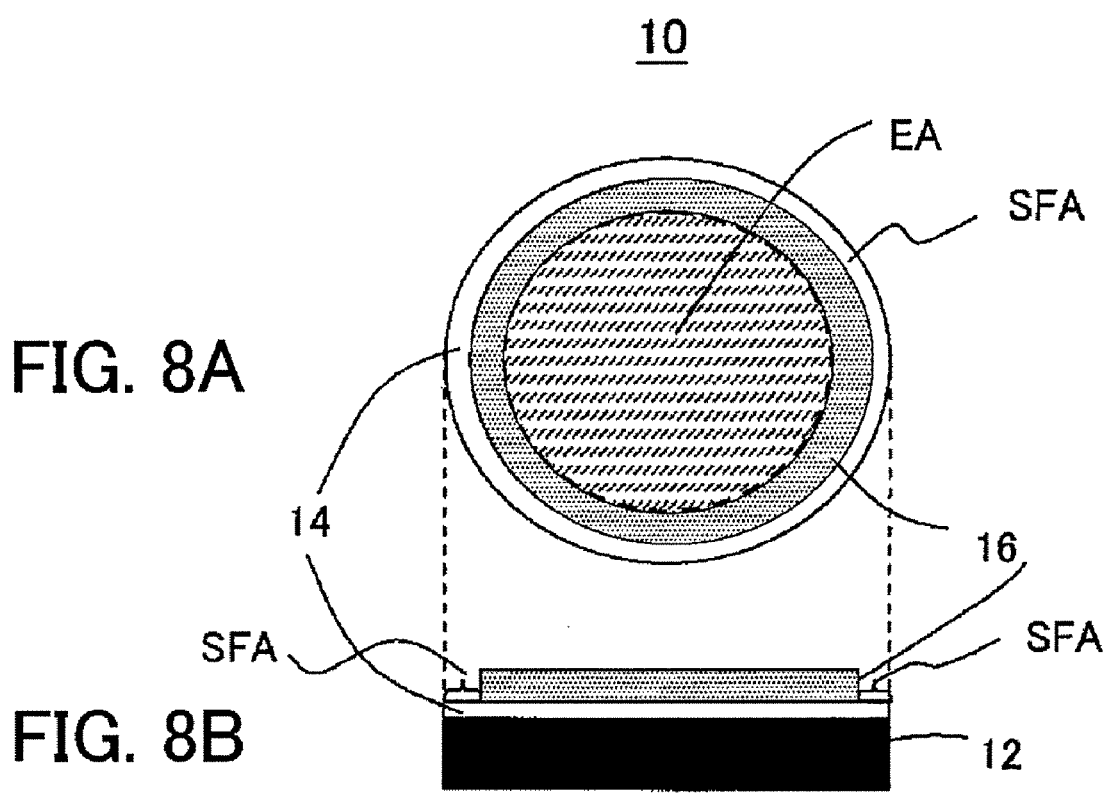
FIGS. 8A and 8B are top and side views of the multilayer mirror according to one aspect of the present invention.

Assume the multilayer mirror 10 in which the area of the reflection layer 16 is different from the area of the stress compensation layer 14, as shown in FIGS. 8A and 8B. FIGS. 8A and 8B are top and side views of the multilayer mirror 10 in which the area of the reflection layer 16 is different from the area of the stress compensation layer 14.

Referring to FIGS. 8A and 8B, there is no reflection layer 16 in the area SFA in which only the stress compensation layer 14 is formed, and the stress is not balanced locally. However, it is sufficient for the multilayer mirror 10 to have a predetermined reflection surface shape in the substrate 12 in an area having the reflection layer 16 or in the effective area EA. Therefore, a shape of the multilayer mirror 10 is preferably well-adjusted based on the stresses of the area of the stress compensation layer 14 and the area of the reflection layer 16. For example, the number of films of the stress compensation layer 14 corresponding to the area SFA in which only the stress compensation layer 14 is formed may be different from the number of layers of the stress compensation layer 14 corresponding to the area in which both the reflection layer 16 and the stress compensation layer 14 are formed.

Figure 9:
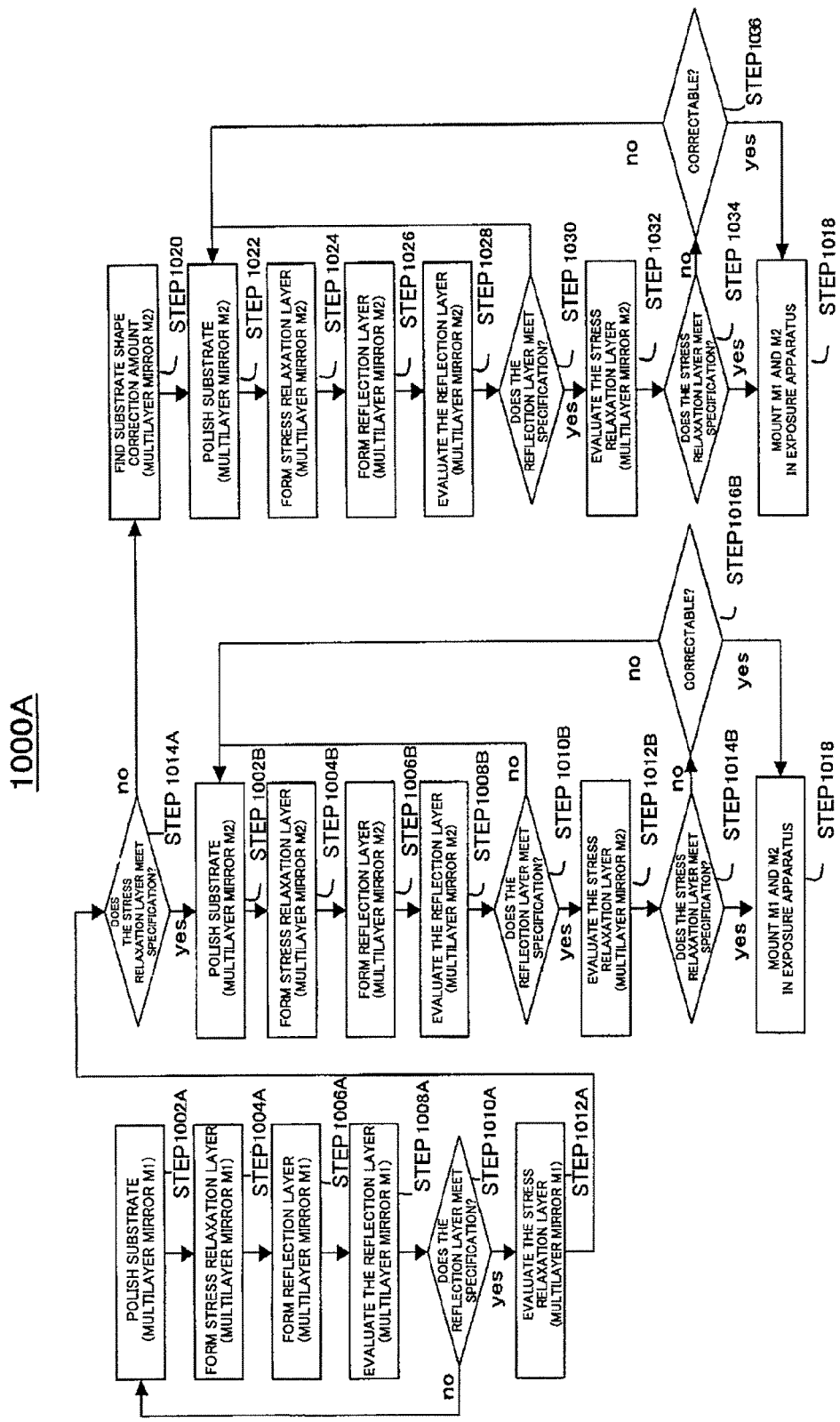
FIG. 9 is a flowchart for explaining an evaluation method of a projection optical system in an exposure apparatus used for the evaluation method shown in FIG. 2.

Referring now to FIG. 9, a description will be given of an evaluation method 1000A of the projection optical system in the exposure apparatus using the evaluation method 1000. In this embodiment, the projection optical system exemplarily has two multilayer mirrors M1 and M2. Of course, the evaluation method 1000A does not limit the number of multilayer mirrors in the optical system to two, and more than two multilayer mirrors may be used. The steps 1002A to 1014A in the procedure to an evaluation of the stress compensation layer of the multilayer mirror M1 are similar to the steps 1002 to 1014 in the evaluation method 1000. When the stress compensation layer of the multilayer mirror M1 is determined to meet the specification, the steps 1002B to 1016B similar to the steps 1002 to 1006 in the evaluation method 1000 are performed for the multilayer mirror M2. When the stress compensation layer of the multilayer mirror M2 is determined to meet the specification, the multilayer mirrors M1 and M2 are mounted into the exposure apparatus (step 1018). On the other hand, when the stress compensation layer of the multilayer mirror M2 is determined not to meet the specification, the procedure returns to the step 1002B to repeat polishing of the substrate of the multilayer mirror M2.

When the stress compensation layer in the multilayer mirror M1 is determined not to meet the specification in the step 1014A, the influence of the stress compensation layer on the reflected wavefront of the multilayer mirror M1 is estimated, and the substrate shape correction amount of the multilayer mirror M2 is found (step 1020). For example, when the curvature of the multilayer mirror M1 changes, the curvature of the substrate of the multilayer mirror M2 is changed so as to cancel the influence.

Next, the substrate of the multilayer mirror M2 is polished based on the correction amount found in the step 1020 (step 1022). After polishing of the multilayer mirror M2 ends, the stress compensation layer and the reflection layer are formed and the evaluated (steps 1024 to 1036). The steps 1024 to 1036 after polishing of the multilayer mirror M2 are similar to the steps 1004 to 1006 in the evaluation method 1000.

When the stress compensation layer of the multilayer mirror M2 meets the specification or is correctable, the multilayer mirrors M1 and M2 are mounted into the exposure apparatus (step 1018).

Thus, the evaluation method 1000A can make the projection optical system of the multilayer mirrors M1 and M2 in each of which the stress compensation layer 14 and the reflection layer 16 meet the specification, providing an excellent optical characteristic (imaging characteristic).

This embodiment repeats polishing of the substrate of the multilayer mirror M2 when determining that the correction is unavailable in the evaluation of the stress compensation layer of the multilayer mirror M2, but the procedure may repeat from polishing of the substrate of the multilayer mirror M1. In addition, this embodiment exemplarily discusses a curvature change of the multilayer mirror M1, but may reduce the influence on the reflected wavefront even in other determinants by correcting the substrate shape of the multilayer mirror M2. When the layer thickness of the stress compensation layer in the multilayer mirror M1 locally changes, the substrate of the multilayer mirror M2 may be polished so as to cancel out the influence.

Figure 10:
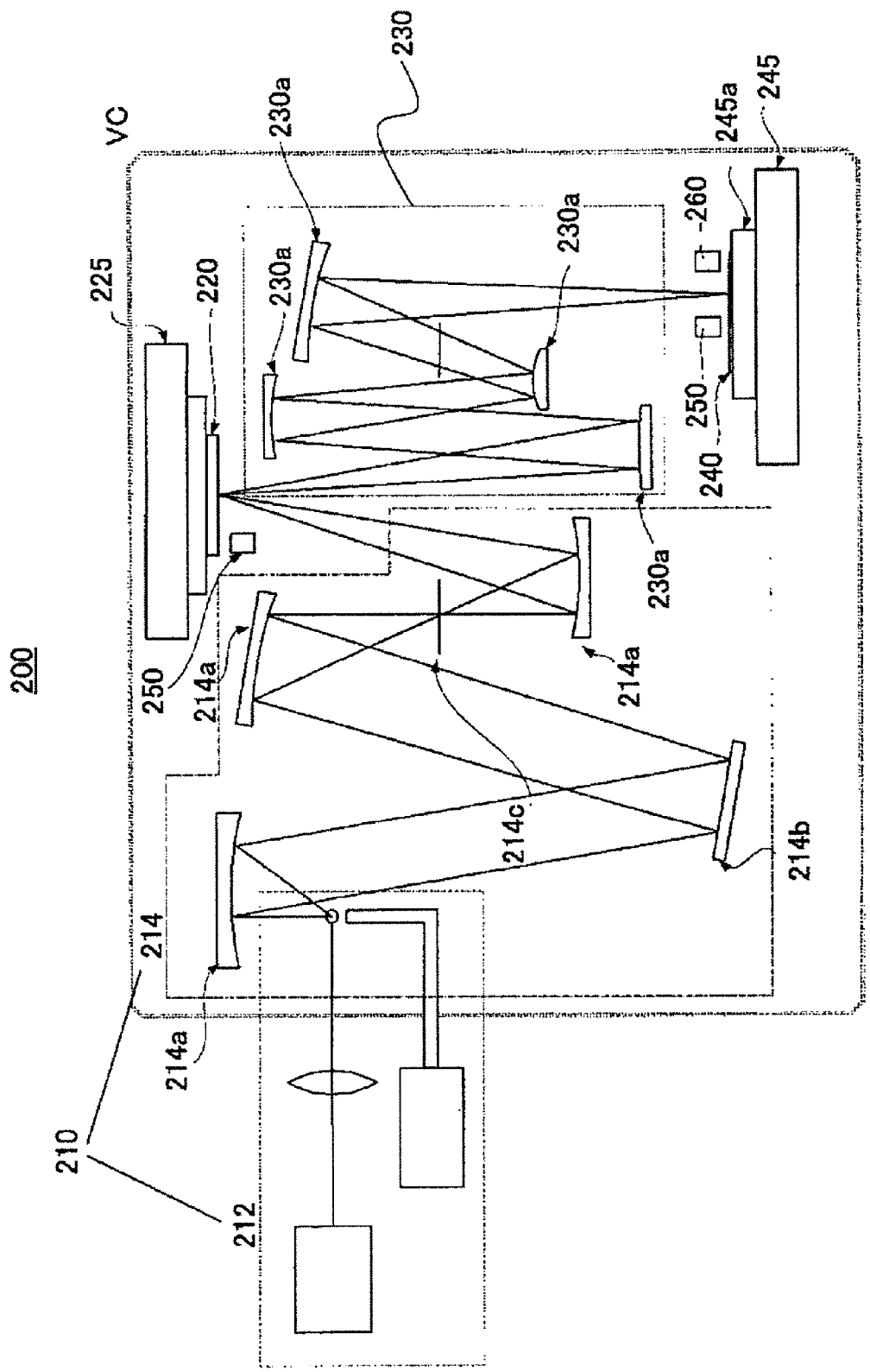
FIG. 10 is a schematic sectional view showing a structure of an exposure apparatus according to one aspect of the present invention.

Referring now to FIG. 10, a description will be given of the inventive exposure apparatus 100. Here, FIG. 10 is a schematic sectional view of the exposure apparatus 200. The inventive exposure apparatus 200 is a projection exposure apparatus that uses the EUV light (with a wavelength, for example, of 13.4 nm) for the exposure light, and provides step-and-scan exposure. While this embodiment uses the step-and-scan manner, the present invention is not limited to this embodiment, and may use a step-and-repeat manner or another exposure apparatus.

The exposure apparatus 200 includes an illumination apparatus 210, a mask stage 225 that supports a mask 220, a projection optical system 230, a wafer stage 245 that supports a substrate 240, an alignment detection mechanism 250, and a focus position detection mechanism 260.

The exposure apparatus 200 has a vacuum chamber VC, as shown in FIG. 10, so as to maintain vacuum at least an optical path of the EUV light, since the EUV light has a low transmittance to air and a reaction between the EUV light and the residue gas component, such as a polymer organic gas, causes contaminations.

The illumination apparatus 210 uses the EUV light of an arc shape corresponding to an arc field of the projection optical system 230 to illuminate the mask 220, and includes a EUV light source 212 and an illumination optical system 214.

The EUV light source 212 uses a laser plasma light source, which irradiates the EUV light with a wavelength of about 13 nm.

The illumination optical system 214 includes a condenser mirror 214a, and an optical integrator 214b. The condenser mirror 214a serves to collect the EUV light that is isotropically irradiated from the laser plasma. The optical integrator 214b serves to uniformly illuminate the mask 220 with a predetermined NA. The illumination optical system 214 may further include an aperture to limit an illumination area to an arc shape at a position conjugate with the mask 220.

The condenser mirror 214a in the illumination optical system 214 uses the multilayer mirror 10 that is determined usable by the inventive evaluation method 1000. Of course, the illumination optical system 214 may use the multilayer mirror 10 that is determined usable by the inventive evaluation method 1000A. The multilayer mirror is arranged so that the EUV light is incident upon or irradiated onto the (second) area in which both the reflection layer and the stress compensation layer are formed. The multilayer mirror is arranged so that the EUV light is not incident upon or irradiated onto the (first) area in which only the stress compensation layer is formed. Thereby, the illumination optical system 214 can exhibit the excellent optical characteristic.

The mask 220 is a reflection mask that has a circuit pattern or image to be transferred, and supported and driven by the mask stage 225. The diffracted light from the mask 220 is reflected on the projection optical system 230 and projected onto the substrate 240.

The mask stage 225 supports the mask 220 and is connected to a moving mechanism (not shown).

The projection optical system 230 uses plural multilayer mirrors 230a to project a reduced size of a pattern of the mask 220 onto the substrate 240. The number of multilayer mirrors 230a is about four to about eight. In order to realize a wide exposure area with the small number of mirrors, the mask 220 and substrate 240 are simultaneously scanned to transfer a wide area that is an arc-shaped area or ring field apart from the optical axis by a predetermined distance. The projection optical system 230 has a NA of about 0.25 to about 0.4.

The multilayer mirror 230a in the projection optical system 230 uses the multilayer mirror 10 that is determined usable by the inventive evaluation method 1000. Of course, the projection optical system 230 may use the multilayer mirror 10 that is determined usable by the inventive evaluation method 1000A. The multilayer mirror is arranged so that the EUV light is incident upon or irradiated onto the (second) area in which both the reflection layer and the stress compensation layer are formed. The multilayer mirror is arranged so that the EUV light is not incident upon or irradiated onto the (first) area in which only the stress compensation layer is formed. Thereby, the projection optical system 230 can exhibit the excellent optical characteristic.

The instant embodiment uses a wafer as the substrate 240 to be exposed, but it may include a liquid crystal plate and a wide range of other plates to be exposed. A photoresist is applied onto the substrate 240.

The wafer stage 245 supports the substrate 240 by a wafer chuck 245a.

The alignment detection mechanism 250 measures a positional relationship between the position of the mask 220 and the optical axis of the projection optical system 230, and a positional relationship between the position of the substrate 240 and the optical axis of the projection optical system 230, and sets positions and angles of the mask stage 225 and the wafer stage 245 so that a projected image of the mask 220 may be positioned in place on the substrate 240.

A focus position detection mechanism 260 measures a focus position on the substrate 240 plane in the Z direction, and its control over positions and angles of the wafer stage 245 always maintain the substrate 240 plane at an imaging position of the projection optical system 230 during exposure.

In exposure, the EUV light emitted from the illumination apparatus 210 illuminates the mask 220, and images a pattern of the mask 220 onto the substrate 240 surface. This embodiment uses an arc or ring shaped image plane, scans the mask 220 and substrate 240 at a speed ratio corresponding to a reduction ratio to expose the entire surface of the mask 220.

The illumination optical system 214 and the projection optical system 230 in the exposure apparatus 200 uses the multilayer mirror 10 that is determined usable by the inventive evaluation method 1000 or 1000A. The illumination optical system 214 and the projection optical system 230 reflect the EUV light at a high reflectance, and exhibit an excellent imaging characteristic. Thereby, the exposure apparatus 200 can provide a high quality device, such as a semiconductor device and a liquid crystal display device, with a high throughput and economical efficiency.

Figure 11:
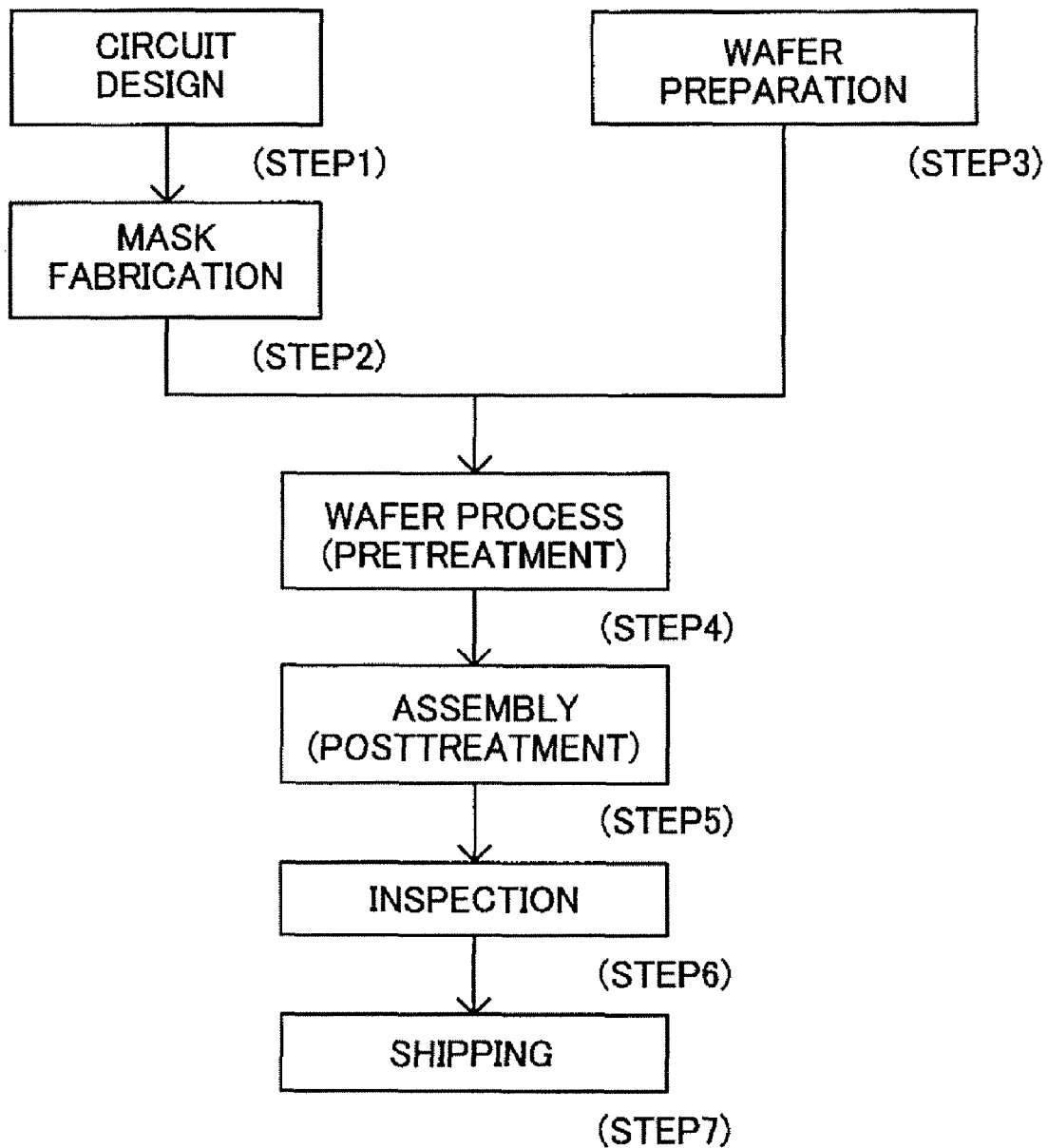
FIG. 11 is a flowchart for explaining manufacture of devices, such as a semiconductor chip (e.g., an IC and an LSI), an LCD, and a CCD.
Figure 12:
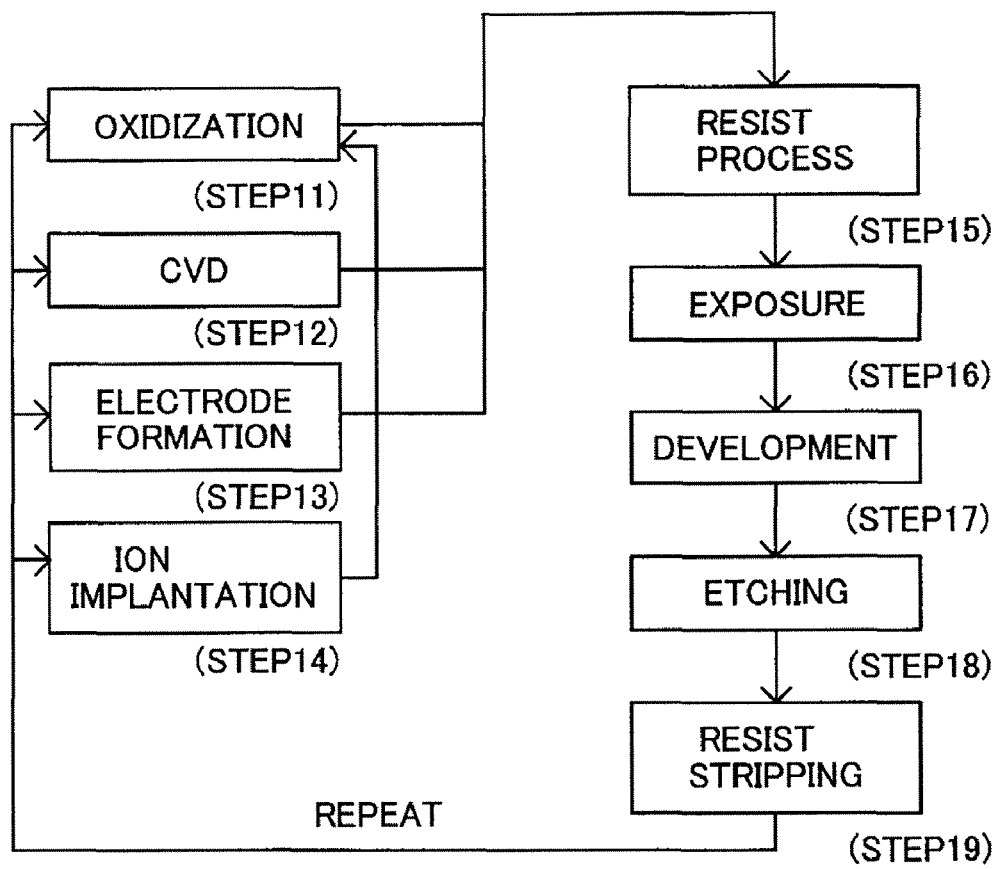
FIG. 12 is a detailed flowchart of a wafer process as Step 4 shown in FIG. 11.

Referring now to FIGS. 11 and 12, a description will be given of an embodiment of a device manufacturing method using the above exposure apparatus 200. FIG. 11 is a flowchart for explaining a fabrication of a device, such as a semiconductor device and a liquid crystal display device. Here, a description will be given of a fabrication of a semiconductor device in an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 12 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the above exposure apparatus 1 to expose a mask pattern onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. This device manufacturing method can manufacture higher quality devices than ever. Thus, the device manufacturing method that uses the exposure apparatus 200, and its resultant products also constitute one aspect of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-160512, filed on Jun. 9, 2006, which is hereby incorporated by reference herein in its entirety.

What is claimed is:

1. A multilayer mirror for EUV light, said multilayer mirror comprising:
   a substrate;
   a reflection layer for reflecting the EUV light;
   a stress compensation layer, formed between the substrate and the reflection layer, for compensating a deformation of the substrate by the reflection layer,
   wherein there is a first area on the substrate, in which the stress compensation layer is formed and the reflection layer is not formed,
   wherein there is a second area on the substrate, in which both the reflection layer and the stress compensation layer are formed, and
   wherein the number of layers of the stress compensation layer in the first area is less than the number of layers of the stress compensation layer in the second area.

2. A multilayer mirror according to claim 1, wherein only the stress compensation layer is layered on the substrate in the first area.

3. A multilayer mirror according to claim 1, wherein the substrate has plural first areas.

4. A multilayer mirror according to claim 3, wherein the plural first areas are formed along a direction in which a layer thickness of the reflection layer changes.

5. An exposure apparatus for exposing a wafer, said exposure apparatus comprising a multilayer mirror for introducing EUV light from a light source to the wafer, the multilayer mirror including:
- a substrate;
- a reflection layer for reflecting the EUV light; and
- a stress compensation layer, formed between the substrate and the reflection layer, for compensating a deformation of the substrate by the reflection layer, wherein the substrate has a first area and a second area, the stress compensation layer is layered but no reflection layer is layered on the substrate in the first area, the multilayer mirror being arranged so that the EUV light can be incident upon the second area, in which both the reflection layer and the stress compensation layer are layered on the substrate, and wherein the number of layers of the stress compensation layer in the first area is less than the number of layers of the stress compensation layer in the second area.

6. An exposure apparatus according to claim 5, wherein the multilayer mirror being arranged so that the EUV light cannot be incident upon the first area.

7. A device manufacturing method comprising:
- exposing a substrate using an exposure apparatus according to claim 5; and
- developing the substrate that has been exposed.

* * * * *